(12) United States Patent
Teng

(10) Patent No.: US 9,737,901 B2
(45) Date of Patent: Aug. 22, 2017

(54) FLUID NOZZLE DEVICE AND METHOD FOR CLEANING A SUBSTRATE USING THE SAME

(71) Applicant: els System Technology Co., Ltd., Zhubei, Hsinchu County (TW)

(72) Inventor: Chih-Ming Teng, Zhubei (TW)

(73) Assignee: ELS SYSTEM TECHNOLOGY CO., LTD., Zhubei, Hsinchu County (TW)

( * ) Notice: Subject to any disclaimer, the term of this patent is extended or adjusted under 35 U.S.C. 154(b) by 654 days.

(21) Appl. No.: 14/209,972

(22) Filed: Mar. 13, 2014

(65) Prior Publication Data

US 2015/0013727 A1    Jan. 15, 2015

(30) Foreign Application Priority Data

Jul. 10, 2013   (TW) .............................. 102124701 A

(51) Int. Cl.
| | |
|---|---|
| B05B 7/04 | (2006.01) |
| H01L 21/67 | (2006.01) |
| B08B 3/02 | (2006.01) |
| B08B 5/02 | (2006.01) |
| B05B 7/08 | (2006.01) |

(52) U.S. Cl.
CPC .......... B05B 7/0483 (2013.01); B05B 7/0884 (2013.01); B08B 3/024 (2013.01); B08B 5/02 (2013.01); H01L 21/67051 (2013.01)

(58) Field of Classification Search
CPC .......... H01L 21/67051; B05B 7/0416–7/0491; B05B 7/0884
See application file for complete search history.

(56) References Cited

U.S. PATENT DOCUMENTS

| | | | | |
|---|---|---|---|---|
| 5,918,817 A | * | 7/1999 | Kanno | ................. B05B 7/0433 239/423 |
| 2008/0035754 A1 | * | 2/2008 | Aruga | ............... H01L 21/02063 239/97 |
| 2012/0160275 A1 | * | 6/2012 | Higashijima | ..... H01L 21/67051 134/26 |

* cited by examiner

*Primary Examiner* — Jason Ko
*Assistant Examiner* — Spencer Bell
(74) *Attorney, Agent, or Firm* — Pillsbury Winthrop Shaw Pittman LLP

(57) ABSTRACT

A fluid nozzle device includes: at least one fluid nozzle which includes a nozzle body having a first inner surface, a second inner surface that is opposite to and spaced apart from the first inner surface, an inner bottom surface that interconnects the first and second inner surfaces and that cooperates with the first and second inner surfaces to define a receiving space thereamong; a gas-intake tube disposed on top of the nozzle body; a liquid-intake tube formed with a liquid inlet and having at least one liquid outlet that is distal from the gas-intake tube; and a plurality of ejecting channels spaced apart from each other and disposed in the nozzle body.

4 Claims, 10 Drawing Sheets

FLUID NOZZLE DEVICE AND METHOD FOR CLEANING A SUBSTRATE USING THE SAME

CROSS-REFERENCE TO RELATED APPLICATION

This application claims priority of Taiwanese Application No. 102124701, filed on Jul. 10, 2013, the entire disclosure of which is hereby incorporated by reference.

BACKGROUND OF THE INVENTION

1. Field of the Invention

The invention relates to a fluid nozzle device and a method for cleaning a substrate using the same, more particularly to a fluid nozzle device and a method for cleaning a semiconductor wafer or a substrate for a display using the fluid nozzle device.

2. Description of the Related Art

A semiconductor wafer is made by many process steps, and may potentially be contaminated by pollutants in the process steps, such as residual chemical liquid or residual chemical polymer. The pollutants on a surface of the semiconductor wafer may cause defects or malfunction of components of the wafer. Thus, a cleaning process is required to remove the pollutants from the semiconductor wafer using a cleaning solution.

A conventional method for cleaning the semiconductor wafer is to soak the semiconductor wafer in a chemical agent. However, the cleaning effect attributed to the conventional method is poor, and yield of the subsequent process using the semiconductor wafer may be adversely influenced. Moreover, it is complicated to dispose the used chemical agent.

SUMMARY OF THE INVENTION

Therefore, an object of the present invention is to provide a fluid nozzle device with improved cleaning effect and a method for cleaning a substrate using the fluid nozzle device.

According to a first aspect of this invention, there is provided a fluid nozzle device adapted for cleaning a substrate. The fluid nozzle device includes at least one fluid nozzle which includes a nozzle body, a gas-intake tube, a liquid-intake tube, and a plurality of ejecting channels. The nozzle body has a first inner surface, a second inner surface that is opposite to and spaced apart from the first inner surface in a first direction, an inner bottom surface that interconnects the first and second inner surfaces and that cooperates with the first and second inner surfaces to define a receiving space thereamong, and an outer bottom surface at a bottom of the nozzle body. The gas-intake tube is disposed on top of the nozzle body and defines a gas-intake channel that is in fluid communication with the receiving space.

The liquid-intake tube has an end that is connected to the second inner surface, and an opposite end that extends in the first direction through the first inner surface, and that is formed with a liquid inlet spatially communicating the receiving space with the external environment. The liquid-intake tube further has at least one liquid outlet that is distal from the gas-intake tube and that extends in the first direction for spatially communicating the receiving space with an inner space of the liquid-intake tube. The ejecting channels are spaced apart from each other in the first direction and are disposed in the nozzle body. Each of the ejecting channels has opposite open ends that are formed respectively in the inner bottom surface and the outer bottom surface. A process liquid introduced from the liquid-intake tube flows out of the liquid-intake tube through the liquid outlet and is urged by a gas introduced into the receiving space through the gas-intake tube to eject out of the fluid nozzle to the substrate via the ejecting channels.

According to a second aspect of this invention, there is provided a method for cleaning a substrate using the aforesaid fluid nozzle device, including the steps of:

(a) dissolving carbon dioxide in a liquid to form a process liquid; and (b) introducing the process liquid into the nozzle body through the liquid-intake tube, and introducing the gas into the nozzle body through the gas-intake tube to eject the process liquid out of the nozzle body to the substrate via the ejecting channels.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE EMBODIMENTS

Figure 1:
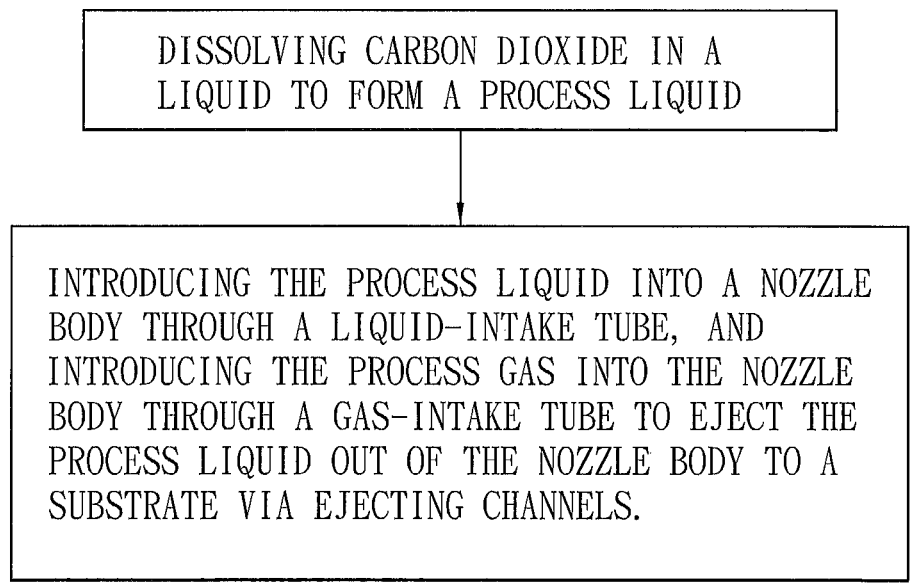
FIG. 1 is a flow chart to illustrate the preferred embodiment of a method for cleaning a substrate according to this invention.
Figure 2:
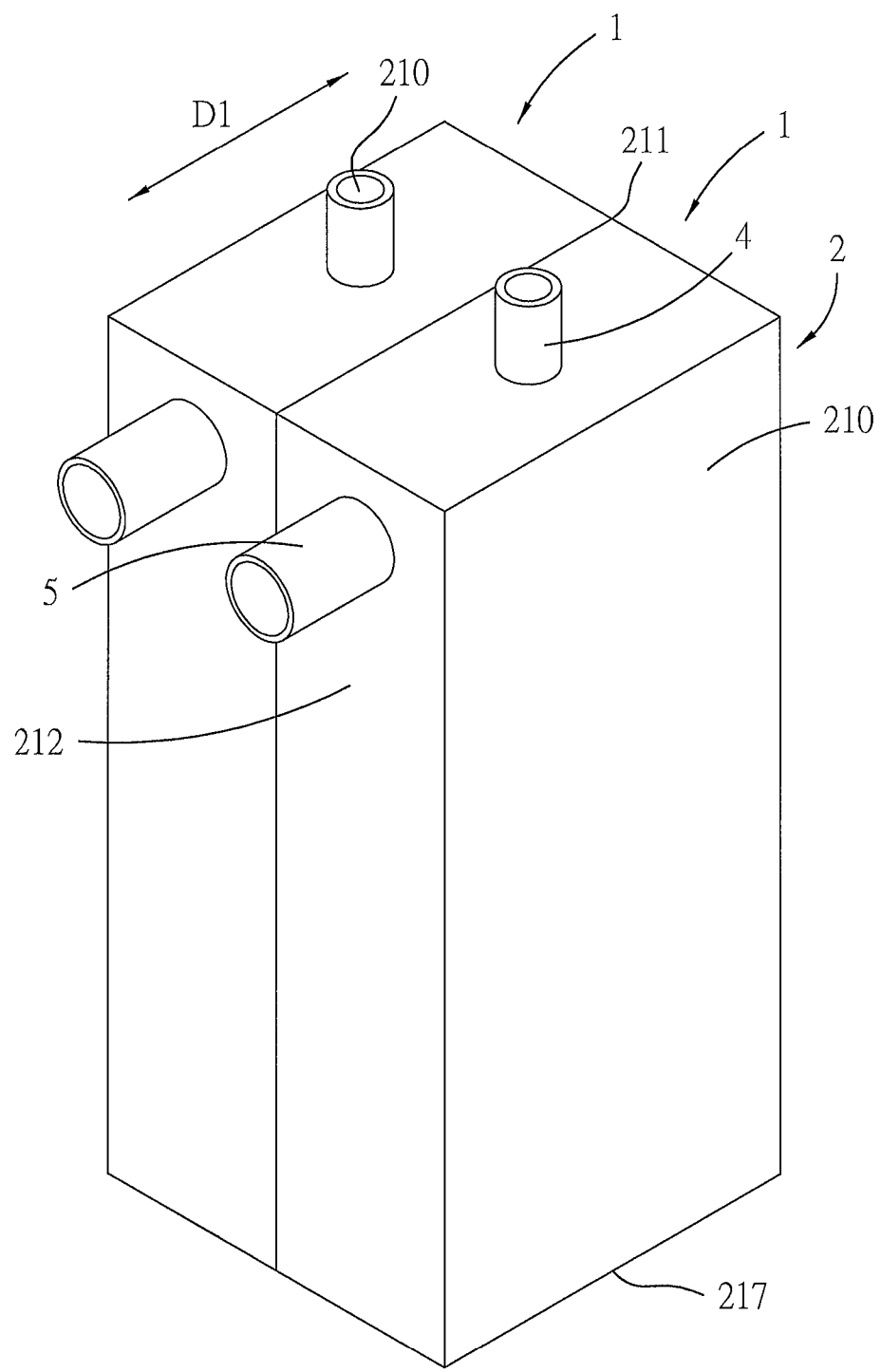
FIG. 2 is a perspective view of the preferred embodiment of a fluid nozzle device according to this invention.
Figure 3:
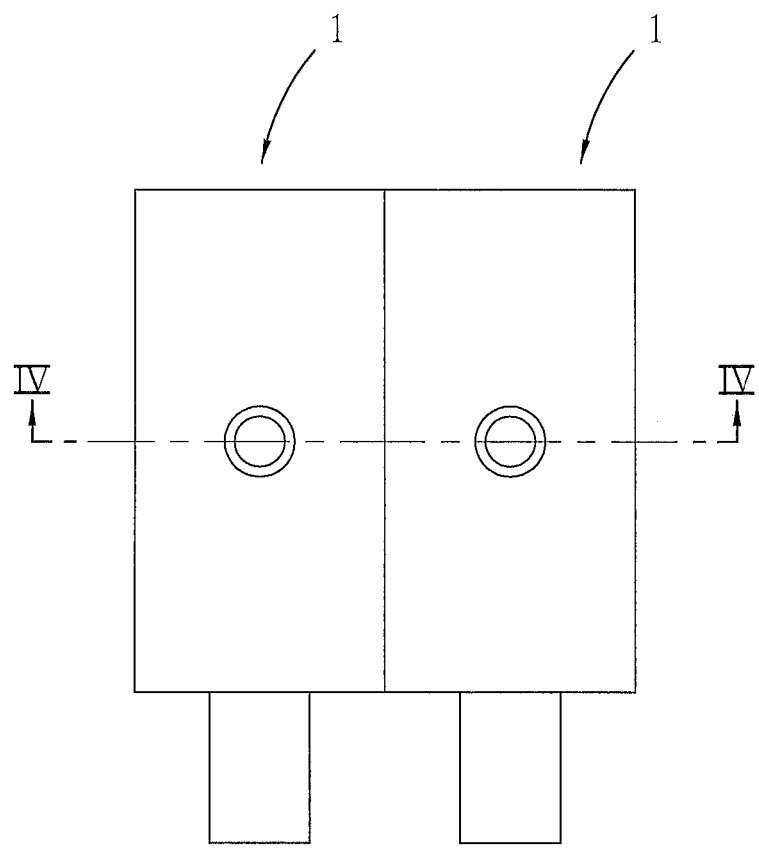
FIG. 3 is a top view of the preferred embodiment of the fluid nozzle device.

Before the present invention is described in greater detail with reference to the accompanying embodiments, it should be noted herein that like elements are denoted by the same reference numerals throughout the following disclosure.

Referring to FIGS. 2, 3, 4, and 5, the preferred embodiment of a fluid nozzle device adapted for cleaning a substrate 9 (see FIG. 7) according to the present invention includes two fluid nozzles 1. Each of the fluid nozzles 1 includes a nozzle body 2, a gas-intake tube 4, a liquid-intake tube 5, and a plurality of ejecting channels 6.

In this embodiment, the nozzle body 2 is substantially rectangular in shape and has a first inner surface 213, a second inner surface 214 that is opposite to and spaced apart from the first inner surface 213 in a first direction (D1), an inner top surface 215 and an inner bottom surface 216 that interconnect the first and second inner surfaces 213, 214 and that cooperate with the first and second inner surfaces 213, 214 to define a receiving space 3 thereamong, and an outer bottom surface 217 at a bottom of the nozzle body 2. The nozzle body 2 further has a first outer side surface 210, a second outer side surface 211 opposite to and spaced apart from the first outer surface 210, and two third outer side surfaces 212 interconnecting the first and second outer side surfaces 210, 211. In this embodiment, the second outer side surfaces 211 of the nozzle bodies 2 of the two fluid nozzles 1 abut against each other so that the two fluid nozzles 1 abut against each other and the first outer side surfaces 210 of the nozzle bodies 2 of the two fluid nozzles 1 serve as opposite outer lateral surfaces of the fluid nozzle device. It should be noted that the two fluid nozzles 1 may be disposed separate from each other in other embodiments of this invention.

The receiving space 3 is substantially rectangular in shape and extends in the first direction (D1).

The gas-intake tube 4 is disposed on top of the nozzle body 2 and defines a gas-intake channel that is in fluid communication with the receiving space 3.

Figure 4:
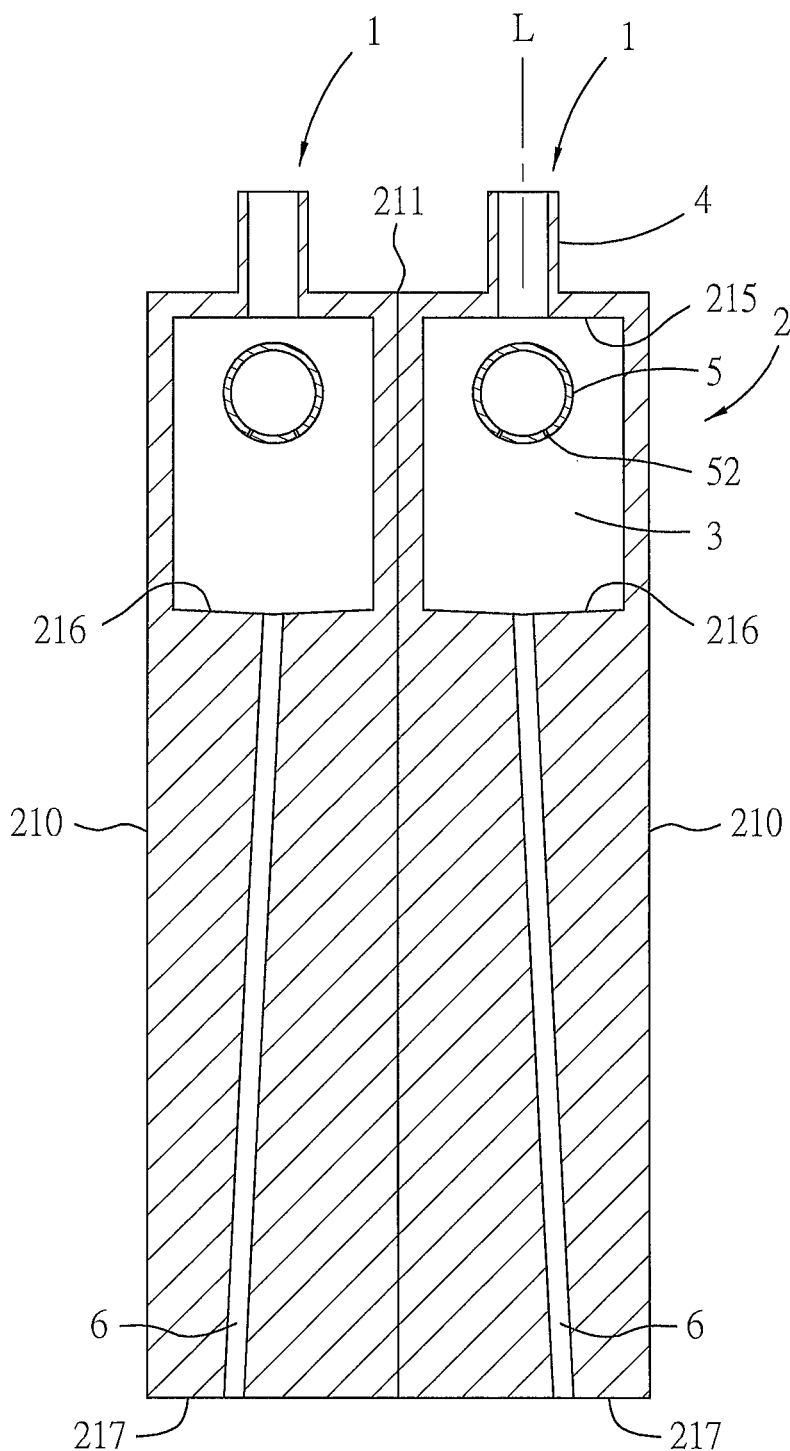
FIG. 4 is a sectional view taken along line IV-IV in FIG. 3.
Figure 5:
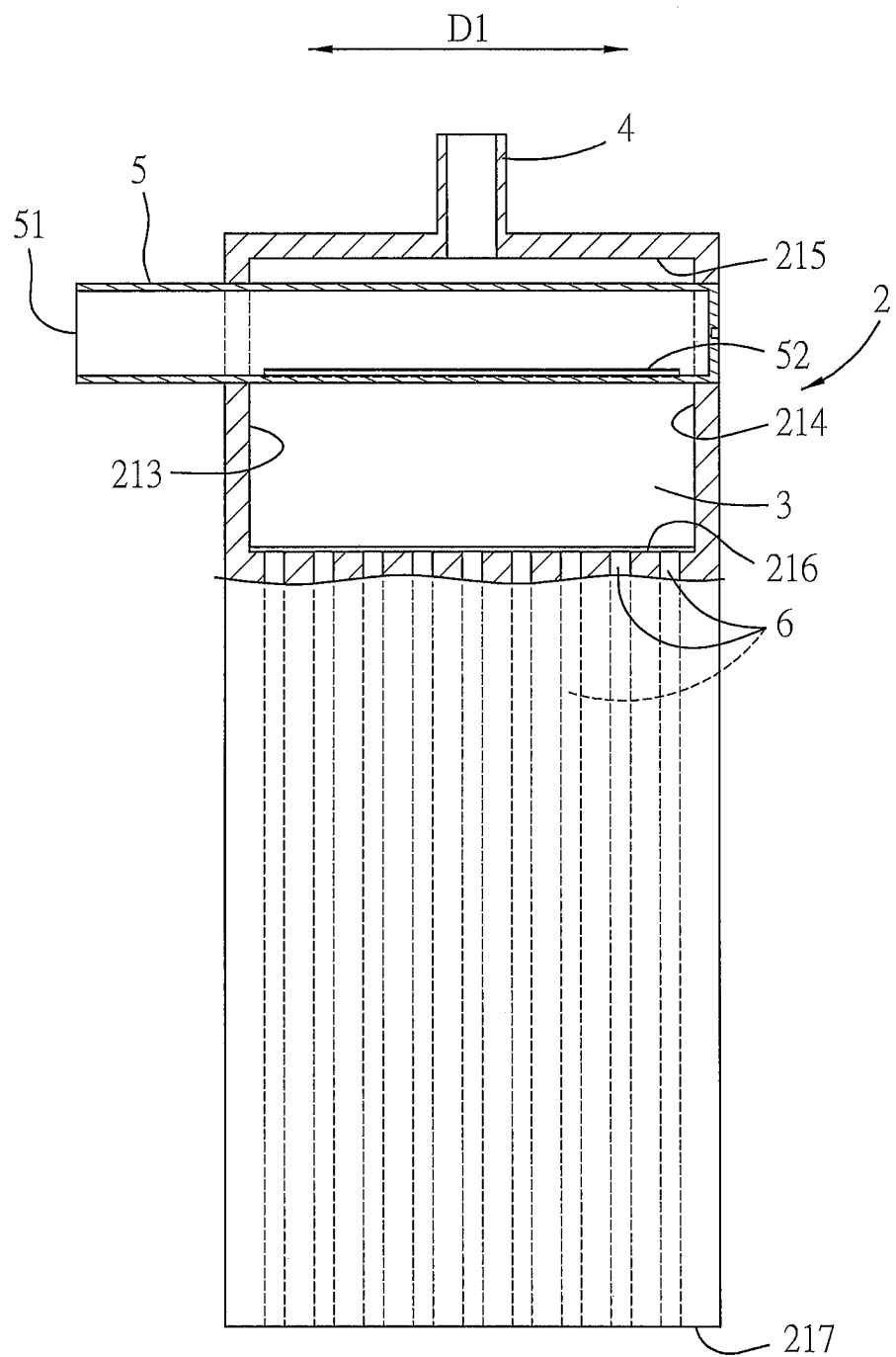
FIG. 5 is a partly sectional view of the preferred embodiment of the fluid nozzle device to illustrate a plurality of ejecting channels that are disposed in a nozzle body and that are in fluid communication with a receiving space.
Figure 6:
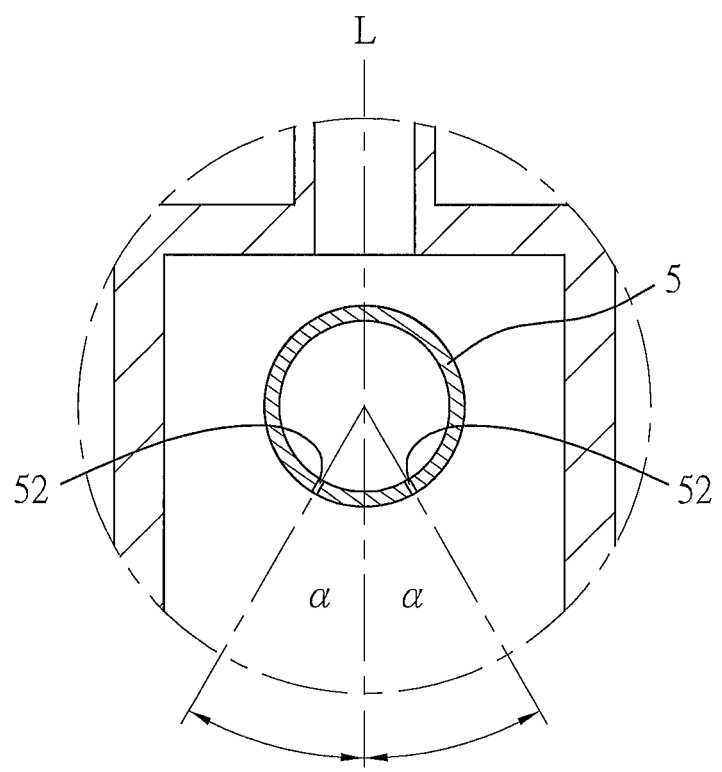
FIG. 6 is an enlarged fragmentary sectional view to illustrate a liquid outlet which is deviated from an axis.

Referring to FIGS. 4, 5, and 6, the liquid-intake tube 5 has an end that is connected to the second inner surface 214, and an opposite end that extends in the first direction (D1) through the first inner surface 213 and one of the third outer surfaces 212, and that is formed with a liquid inlet 51 spatially communicating the receiving space 3 with the external environment.

The liquid-intake tube 5 further has at least one liquid outlet 52 that is distal from the gas-intake tube 4 and that extends in the first direction (D1) for spatially communicating the receiving space 3 with an inner space of the liquid-intake tube 5. In this embodiment, the liquid-intake tube 5 is formed with two of the liquid outlets 52 that are angularly spaced apart from each other. It should be noted that the number of the liquid outlets 52 may vary based on actual requirements.

The gas-intake tube 4 extends along an axis (L) that passes through a center of the top of the nozzle body 2, and an imaginary line between a longitudinal central axis of the liquid-intake tube 5 and each of the liquid outlets 52 is deviated from the axis (L) by an angle ($\alpha$). In this embodiment, the angle ($\alpha$) is 30 degrees. However, the angle ($\alpha$) is not limited thereto and may be adjusted based on actual requirements.

The ejecting channels 6 are spaced apart from each other in the first direction (D1) and are disposed in the nozzle body 2. Each of the ejecting channels 6 has opposite open ends that are formed respectively in the inner bottom surface 216 and the outer bottom surface 217. In the nozzle body 2 of each of the fluid nozzles 1, each of the ejecting channels 6 is inclined with a distance between the one of the ejecting channels 6 and the first outer side surface 210 being gradually decreased toward the outer bottom surface 217. In this embodiment, each of the ejecting channels 6 is an elongated channel so as to speed up the flow velocity of a liquid flowing therethrough.

Figure 7:
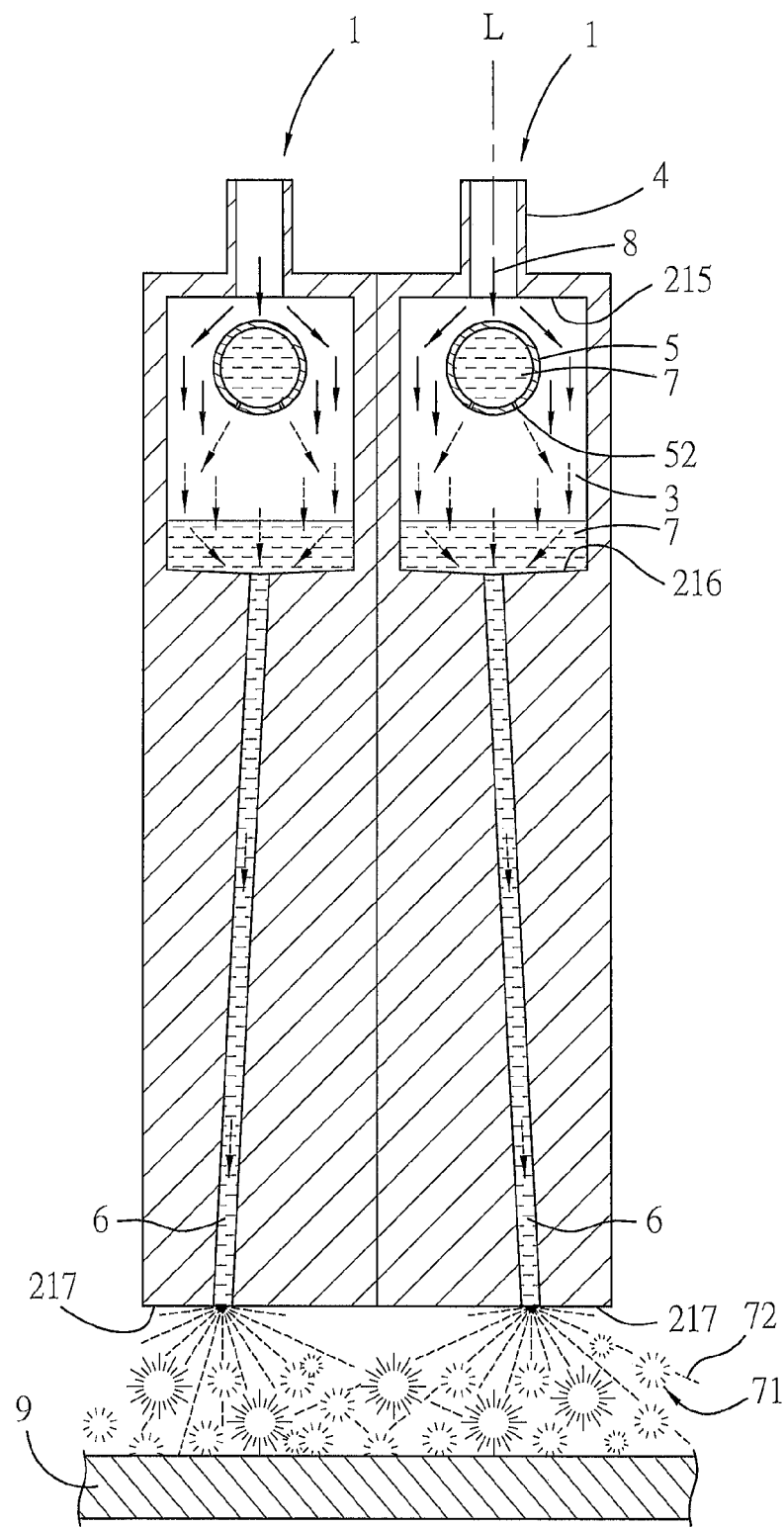
FIG. 7 is a sectional view to illustrate the preferred embodiment of the method using the preferred embodiment of the fluid nozzle device.
Figure 8:
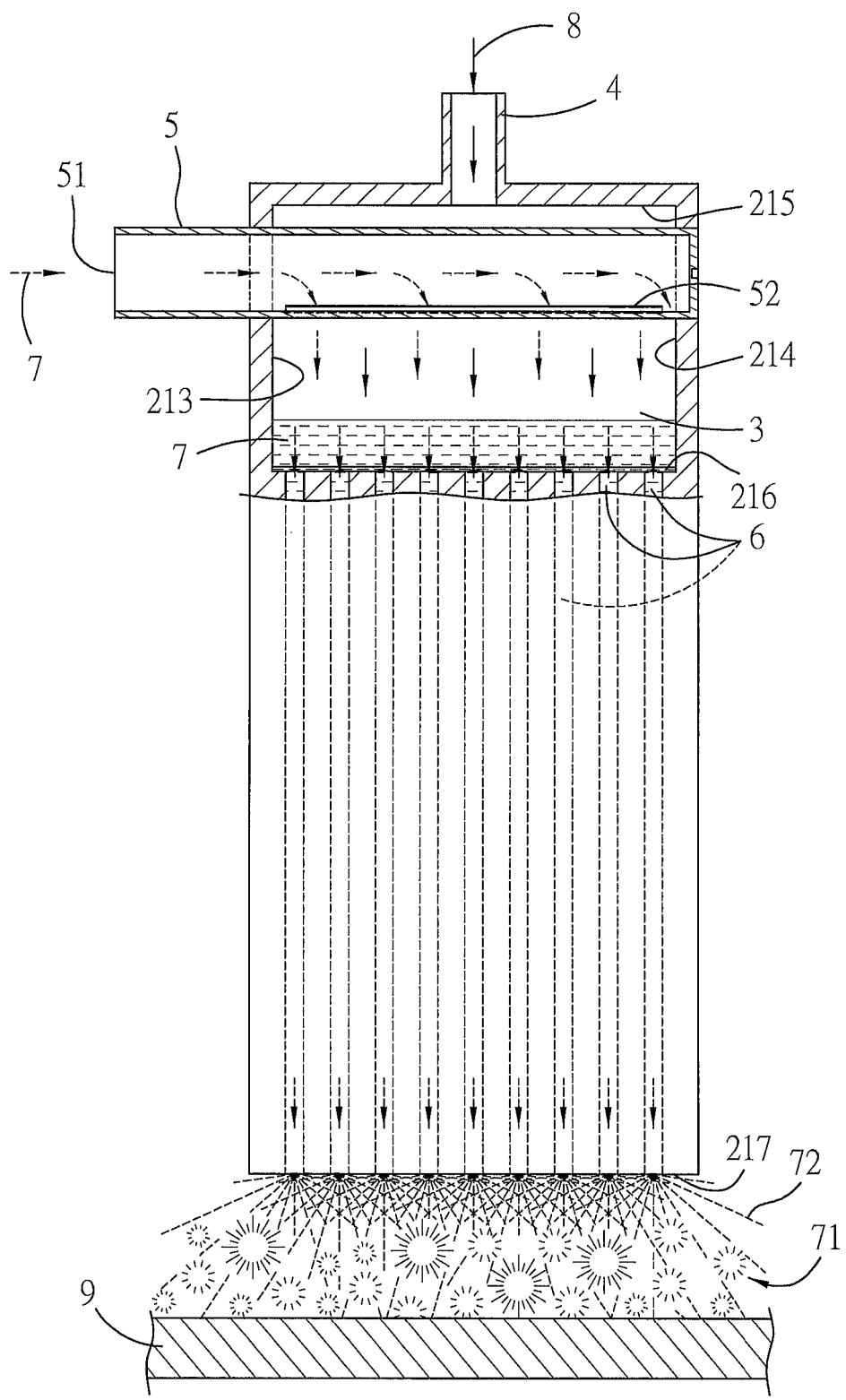
FIG. 8 is another partly sectional view to illustrate the preferred embodiment of the method using the preferred embodiment of the fluid nozzle device.

The preferred embodiment of a method for cleaning the substrate 9 with a process liquid 7 using the fluid nozzle device according to this invention will now be described with reference to FIGS. 1, 7 and 8.

In this embodiment, the liquid-intake tube 5 is designed to be disposed below the gas-intake tube 4. When gas 8 is introduced into the receiving space 3 through the gas-intake tube 4, the gas 8 will be retarded by the liquid-intake tube 5 and be split into two gas flows so as to disperse the pushing force of the gas 8, thereby providing average force to the process liquid 7. At the same time, a large amount of the process liquid 7 is introduced into the liquid-intake tube 5 from the liquid inlet 51 and flows in the liquid-intake tube 5 in the first direction (D1). The process liquid 7 then flows out of the liquid-intake tube 5 through the two liquid outlets 52 into the receiving space 3 and is accumulated in the receiving space 3. The process liquid 7 is then evenly urged by the gas 8 introduced into the receiving space 3 to flow into the ejecting channels 6, to eject out of the fluid nozzle 1 and to spray on the substrate 9. The structural designs of the gas-intake tube 4 and the liquid-intake tube 5 would allow the process liquid 7 in each of the ejecting channels 6 to eject out of the fluid nozzle 1 at an identical ejecting speed, thereby improving ejecting uniformity.

In this embodiment, the process liquid 7 preferably contains carbon dioxide ($CO_2$) 71, i.e., the process liquid 7 is composed of a liquid 72 and $CO_2$ 71. When the $CO_2$-containing process liquid 7 is ejected out of the ejecting channels 6 and comes into contact with the atmosphere, the pressure of the $CO_2$-containing process liquid 7 is reduced so that carbon dioxide 71 dissolved in the $CO_2$-containing process liquid 7 is released due to decreased solubility of the carbon dioxide 71 in the liquid 72. The released carbon dioxide 71 would expand and be expelled to the atmosphere. Meanwhile, the expelled carbon dioxide 71 would increase the spraying efficiency of the liquid 72, thereby improving the impact force of the liquid 72 on the substrate 9 and the ability and efficiency of cleaning the pollutants on the substrate 9. The product yield may be thus improved.

Referring to FIG. 1, the method of this embodiment includes the steps of:

(a) dissolving carbon dioxide 71 in the liquid 72 to form the process liquid 7; and (b) introducing the process liquid 7 into the nozzle body 2 through the liquid-intake tube 5, and introducing the gas 8 into the nozzle body 2 through the gas-intake tube 4 to eject the process liquid 7 out of the nozzle body 2 to the substrate 9 via the ejecting channels 6.

To avoid waste treatment problems, preferably, the liquid 72 in step (a) is deionized water (DIW) or pure water, and the gas 8 in step (b) is clean dry air (CDA).

In step (a), carbon dioxide 71 is pumped into a pipe (not shown) where the liquid 72 flows therethrough, and is dissolved in the liquid 72 to form the $CO_2$-containing process liquid 7. The fluid nozzle device ejects the $CO_2$-containing process liquid 7 intermittently. That is, at the interval between cleaning two adjacent substrates 9, the passageway where the $CO_2$-containing process liquid 7 enters into the liquid-inlet tube 5 is closed. However, at the interval, carbon dioxide 71 is continuously pumped into the pipe and is dissolved in the liquid 72 so that a particular concentration of carbon dioxide 71 could be maintained in the liquid 72. At the time of cleaning the substrate 9, the passageway where the $CO_2$-containing process liquid 7 enters into the liquid-inlet tube 5 would then be re-opened. Due to the aforesaid arrangement, the process liquid 7 would contain a fixed and sufficient amount of carbon dioxide 71, so that the adverse cleaning affect attributed to uneven and insufficient content of carbon dioxide 71 may be prevented.

It should be noted that the number and the distribution of the ejecting channels 6 may be adjusted depending on a size of the substrate 9. In this embodiment, the fluid nozzle device could clean a rectangular area of the substrate 9 and is then moved to clean another rectangular area of the substrate 9.

Figure 9:
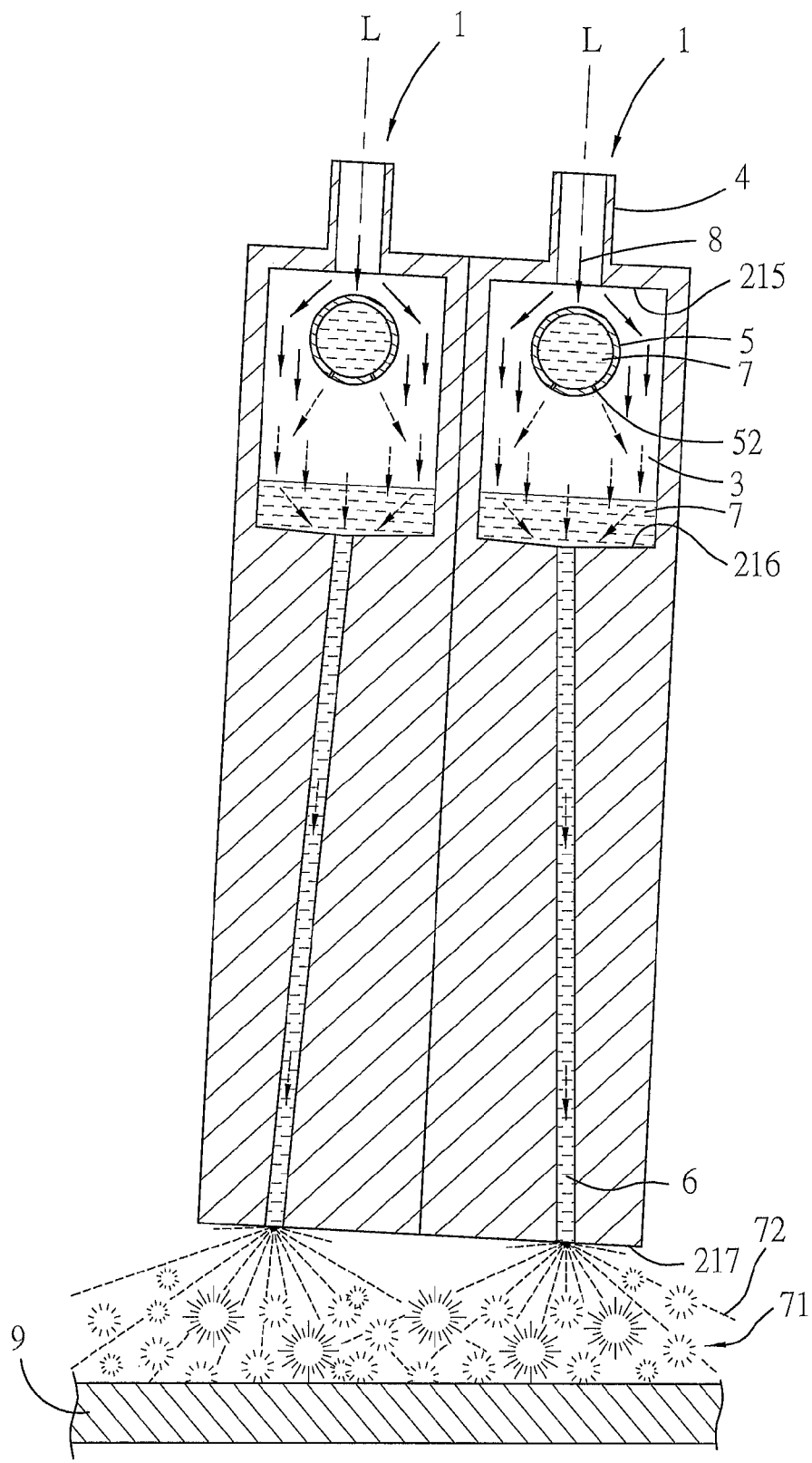
FIG. 9 is a sectional view to illustrate that the preferred embodiment of the fluid nozzle device is adjusted to tilt relative to the substrate.
Figure 10:
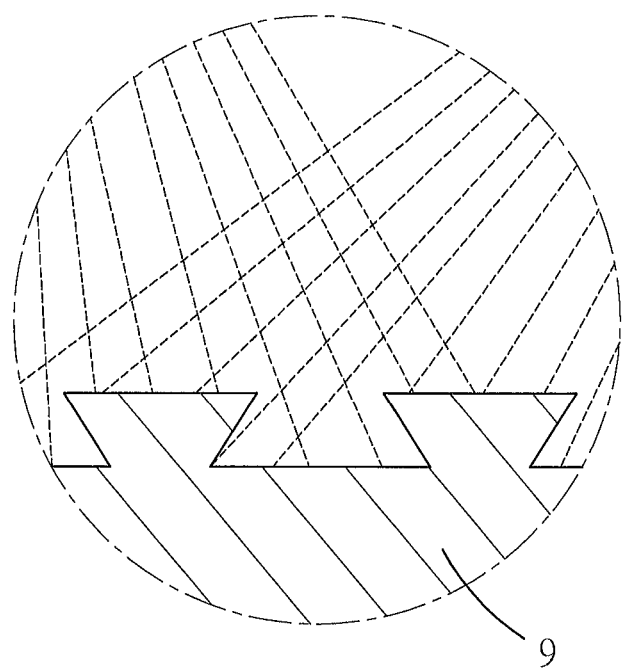
FIG. 10 is an enlarged fragmentary sectional view according to FIG. 9, showing the ejection of the process liquid to the substrate.

Referring to FIGS. 9 and 10, in this embodiment, an angle of the fluid nozzle device may be adjusted with respect to the substrate 9. Specifically, the fluid nozzle device of this invention is held and hung by a holder (not shown) and is tilted with respect to the substrate 9 so as to generate an angle between the axis (L) and the substrate 9. As shown in FIG. 9, the ejecting channels 6 in the two fluid nozzles 1 are adjusted to have different angles relative to the substrate 9, so that the process liquid 7 ejected out of the fluid nozzles 1 would impinge on and clean the substrate 9 with different angles, thereby improving the cleaning effect. The ejecting channels 6 in the two fluid nozzles 1 may vary based on actual requirements.

As shown in FIG. 10, when the substrate 9 has an uneven surface, the tilted fluid nozzle device would allow the process fluid 7 to clean the areas that are difficult to reach and clean.

To sum up, with the structural design of the fluid nozzle device of this invention, the cleaning efficiency could be increased. Moreover, carbon dioxide 71 may also improve cleaning efficiency. Use of the process liquid 7 composed of deionized water/pure water 72 and carbon dioxide 71 would eliminate environment pollution and waste treatment problems.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A fluid nozzle device adapted for cleaning a substrate, said fluid nozzle device comprising two fluid nozzles, each of said fluid nozzles including:
   a nozzle body having a first inner surface, a second inner surface that is opposite to and spaced apart from said first inner surface in a first direction, an inner bottom surface that interconnects said first and second inner surfaces and that cooperates with said first and second inner surfaces to define a receiving space thereamong, and an outer bottom surface at a bottom of said nozzle body;
   a gas-intake tube disposed on top of said nozzle body and defining a gas-intake channel that is in fluid communication with said receiving space;
   a liquid-intake tube having an end that is connected to said second inner surface, and an opposite end that extends in the first direction through said first inner surface, and that is formed with a liquid inlet spatially communicating said receiving space with the external environment, said liquid-intake tube further having at least one liquid outlet that is distal from said gas-intake tube and that extends in the first direction for spatially communicating said receiving space with an inner space of said liquid-intake tube; and
   a plurality of ejecting channels spaced apart from each other in the first direction and disposed in said nozzle body, and each having opposite open ends that are formed respectively in said inner bottom surface and said outer bottom surface;
   wherein a process liquid introduced from said liquid-intake tube flows out of said liquid-intake tube through said liquid outlet and is urged by a gas introduced into said receiving space through said gas-intake tube to eject out of said fluid nozzle to the substrate via said ejecting channels; and
   wherein said nozzle body of each of said fluid nozzles further has an outer side surface, said outer side surfaces of said nozzle bodies serving as opposite outer lateral surfaces of said fluid nozzle device, each of said ejecting channels of each of said fluid nozzles being inclined with a distance between said one of said ejecting channels and said outer side surface of a corresponding one of said nozzle bodies being gradually decreased toward said outer bottom surface of the corresponding one of said nozzle bodies.

2. The fluid nozzle device as claimed in claim 1, wherein said liquid-intake tube is formed with two of said liquid outlets that are angularly spaced apart from each other.

3. The fluid nozzle device as claimed in claim 2, wherein:
   said gas-intake tube extends along an axis that passes through a center of said top of said nozzle body; and
   an imaginary line between a longitudinal central axis of said liquid-intake tube and each of said liquid outlets is deviated from the axis that passes through the center of said top of said nozzle body by an angle.

4. The fluid nozzle device as claimed in claim 3, wherein each of said ejecting channels is an elongated channel.

\* \* \* \* \*